(12) United States Patent
Li

(10) Patent No.: US 10,546,903 B2
(45) Date of Patent: Jan. 28, 2020

(54) ORGANIC ELECTROLUMINESCENT DISPLAY PANEL AND METHOD FOR FABRICATING THE SAME

(71) Applicant: Wuhan China Star Optoelectronics Semiconductor Display Technology Co., Ltd., Wuhan, Hubei (CN)

(72) Inventor: Songshan Li, Hubei (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 112 days.

(21) Appl. No.: 15/578,117

(22) PCT Filed: Sep. 1, 2017

(86) PCT No.: PCT/CN2017/100205
§ 371 (c)(1),
(2) Date: Nov. 29, 2017

(87) PCT Pub. No.: WO2019/028955
PCT Pub. Date: Feb. 14, 2019

(65) Prior Publication Data
US 2019/0221620 A1    Jul. 18, 2019

(30) Foreign Application Priority Data

Aug. 9, 2017  (CN) .......................... 2017 1 0676370

(51) Int. Cl.
*H01L 51/00* (2006.01)
*H01L 27/32* (2006.01)
(Continued)

(52) U.S. Cl.
CPC ...... *H01L 27/3246* (2013.01); *H01L 27/1248* (2013.01); *H01L 27/1259* (2013.01);
(Continued)

(58) Field of Classification Search
CPC ......... H01L 51/00; H01L 51/50; H01L 51/52; H01L 51/56; H01L 51/5206;
(Continued)

(56) References Cited

U.S. PATENT DOCUMENTS

2003/0146695 A1* 8/2003 Seki .................... H01L 27/3246
                                                          313/506
2004/0065910 A1* 4/2004 Yoshiaki ........... H01L 27/14601
                                                          257/291

* cited by examiner

*Primary Examiner* — Chuong A Luu
(74) *Attorney, Agent, or Firm* — Hemisphere Law, PLLC; Zhigang Ma

(57) ABSTRACT

The present invention discloses an organic electroluminescent display panel, including a substrate; a thin film transistor formed on the substrate; a bottom electrode formed on a drain of the thin film transistor; a light-blocking layer formed on the bottom electrode, the light-blocking layer has a first through hole that exposes the bottom electrode; a pixel define layer formed on the thin film transistor, the bottom electrode, and the light-blocking layer, the pixel define layer has a second through hole, the second through hole completely exposes the first through hole; an organic electroluminescent device formed on the bottom electrode, an edge of the organic electroluminescent device is formed on the light-blocking layer; and a top electrode formed on the organic electroluminescent device. The present invention uses the light-blocking layer to block the edge of the organic electroluminescent device, thereby eliminating the non-uniform brightness of the edge of the organic electroluminescent device.

9 Claims, 8 Drawing Sheets

(51) Int. Cl.
*H01L 29/786* (2006.01)
*H01L 51/50* (2006.01)
*H01L 51/52* (2006.01)
*H01L 27/12* (2006.01)
*H01L 51/56* (2006.01)

(52) U.S. Cl.
CPC ...... *H01L 27/3244* (2013.01); *H01L 27/3272* (2013.01); *H01L 29/78621* (2013.01); *H01L 29/78675* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5221* (2013.01); *H01L 51/5262* (2013.01); *H01L 51/5281* (2013.01); *H01L 51/56* (2013.01)

(58) Field of Classification Search
CPC ............. H01L 51/5221; H01L 51/5088; H01L 51/5012; H01L 51/5072; H01L 51/5092; H01L 51/5056; H01L 51/5262; H01L 51/5281; H01L 51/52068; H01L 27/3246; H01L 27/1248; H01L 27/1259; H01L 27/3244; H01L 27/3272
USPC .......................................................... 257/40
See application file for complete search history.

ORGANIC ELECTROLUMINESCENT DISPLAY PANEL AND METHOD FOR FABRICATING THE SAME

RELATED APPLICATIONS

The present application is a National Phase of International Application Number PCT/CN2017/100205, filed Sep. 1, 2017, and claims the priority of China Application No. 201710676370.0, filed Aug. 9, 2017.

FIELD OF THE DISCLOSURE

The present invention relates to an organic electroluminescent display technical field, particularly to an organic electroluminescent display panel and a method for fabricating the same.

BACKGROUND

In recent years, organic light-emitting diode (OLED) display panels becomes very popular in the world since OLED display panels feature self-illumination, wide view angle, short response time, high lighting efficiency, wide color gamut, thin thickness, large size, flexibility, simple fabrication, and low cost.

Presently, in an OLED display panel, a pixel define layer (PDL) is formed by coating, exposure, development, and baking processes. Wherein, the top surface of the PDL is hydrophobic and the side surface of the PDL is hydrophile. When an organic electroluminescent device is fabricated, ink formed by function layers is printed on the PDL. Thus, the thickness of the PDL is thicker from center to edge, thereby resulting in non-uniform brightness when current flows through the edges of the function layers.

SUMMARY

In order to overcome the abovementioned problem, the primary objective of the present invention is to provide an organic electroluminescent display panel and a method for fabricating the same, which eliminate the non-uniform brightness of the edge of the organic electroluminescent device.

To achieve the abovementioned objectives, the present invention proposes an organic electroluminescent display panel, which comprises a substrate; a thin film transistor formed on the substrate; a bottom electrode formed on a drain of the thin film transistor; a light-blocking layer formed on the bottom electrode, the light-blocking layer has a first through hole that exposes the bottom electrode; a pixel define layer formed on the thin film transistor, the bottom electrode, and the light-blocking layer, the pixel define layer has a second through hole, a diameter of the second through hole is larger than a diameter of the first through hole, and the second through hole completely exposes the first through hole; an organic electroluminescent device formed on the bottom electrode, and an edge of the organic electroluminescent device is formed on the light-blocking layer; and a top electrode formed on the organic electroluminescent device.

In an embodiment of the present invention, the central axis of the first through hole is aligned to the central axis of the second through hole.

In an embodiment of the present invention, the light-blocking layer comprises silicon-rich oxide or silicon-rich nitride that is insulated and opaque.

In an embodiment of the present invention, the pixel define layer comprises polymethylmethacrylate (PMMA) or polyimide (PI).

In an embodiment of the present invention, the thin film transistor further comprises a polysilicon layer formed on the substrate, and the polysilicon layer comprises a non-doped layer, a heavily-doped layer formed at two sides of the non-doped layer, and a lightly-doped layer formed between the non-doped layer and the heavily-doped layer; a gate insulation layer formed on the polysilicon layer and the substrate; a gate formed on the gate insulation layer and over the polysilicon layer; an interlayer insulation layer formed on the gate and the gate insulation layer; a third through hole and a fourth through hole respectively penetrating through the interlayer insulation layer and the gate insulation layer; a source and a drain formed on the interlayer insulation layer, and contacting the heavily-doped layer via the first through hole and the second through hole; a flat layer formed on the interlayer insulation layer, the source, and the drain; and a fifth through hole penetrating through the flat layer to expose the drain.

In an embodiment of the present invention, the thin film transistor further comprises a buffer layer formed between the substrate and both of the polysilicon layer and the gate insulation layer.

In an embodiment of the present invention, the organic electroluminescent device further comprises a hole injection layer, hole transporting layer, an organic emission layer, an electron transporting layer, and an electron injection layer formed from the bottom electrode to the top electrode.

In an embodiment of the present invention, the bottom electrode or the top electrode is transparent or semi-transparent, and the other electrode is opaque and light-reflecting.

The present invention proposes a method for fabricating an organic electroluminescent display panel, which comprises: providing a substrate; forming a thin film transistor on the substrate; forming a bottom electrode on a drain of the thin film transistor forming a light-blocking layer on the bottom electrode; forming a first through hole in the light-blocking layer to expose the bottom electrode; forming a pixel define layer on the thin film transistor, the bottom electrode, and the light-blocking layer; forming a second through hole in the pixel define layer to completely expose the first through hole, wherein a diameter of the second through hole is larger than a diameter of the first through hole; forming an organic electroluminescent device on the bottom electrode and the light-blocking layer, and forming an edge of the organic electroluminescent device on the light-blocking layer; and forming a top electrode on the organic electroluminescent device.

In an embodiment of the present invention, the step of forming the thin film transistor on the substrate further comprises: forming a buffer layer on the substrate; forming a polysilicon layer on the substrate, and the polysilicon layer comprises a non-doped layer, a heavily-doped layer formed at two sides of the non-doped layer, and a lightly-doped layer formed between the non-doped layer and the heavily-doped layer forming a gate insulation layer on the polysilicon layer and the substrate; forming a gate on the gate insulation layer and over the polysilicon layer; forming an interlayer insulation layer on the gate and the gate insulation layer, forming a third through hole and a fourth through hole in the interlayer insulation layer to respectively penetrate through the interlayer insulation layer and the gate insulation layer; forming a source on the interlayer insulation layer to fill the third through hole and contact the heavily-doped layer, and forming a drain on the interlayer insulation layer to fill the fourth through hole and contact the heavily-doped layer; forming a flat layer on the interlayer insulation layer, the source, and the drain; and forming a fifth through hole in the flat layer to expose the drain.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the figures.

DETAILED DESCRIPTION OF PREFERRED EMBODIMENTS

Figure 1:
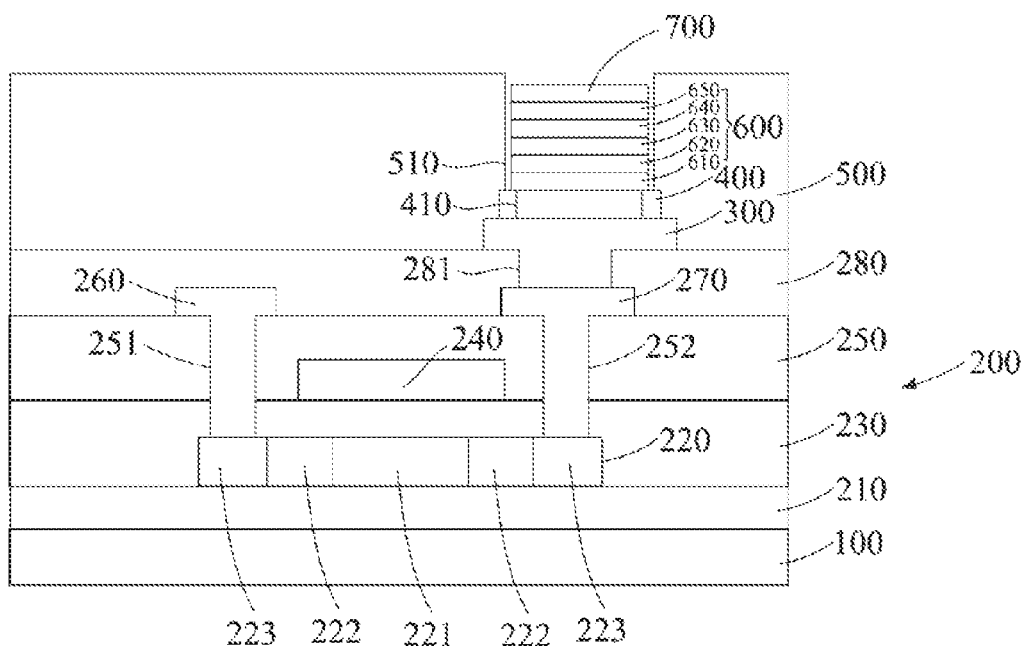
FIG. 1 is a diagram schematically showing an organic electroluminescent display panel according to one embodiment of the present invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Throughout the description and claims, it will be understood that when a component is referred to as being "formed on" another component, it can be directly on the other component, or intervening component may be present. In contrast, when a component is referred to as being "directly on" another component, there are no intervening components present.

FIG. 1 is a diagram schematically showing an organic electroluminescent display panel according to one embodiment of the present invention.

Refer to FIG. 1. According to an embodiment of the present invention, the organic electroluminescent display panel comprises a substrate 100, a thin film transistor 200, a bottom electrode 300, a light-blocking layer 400, a pixel define layer 500, an organic electroluminescent device 600, and a top electrode 700. In an embodiment of the present invention, the thin film transistor 200 comprises a buffer layer 210, a polysilicon layer 220, a gate insulation layer 230, a gate 240, an interlayer insulation layer 250, a source 260, a drain 270, and a flat layer 280, but the present invention is not limited thereto. The thin film transistor may be an amorphous silicon thin film transistor or a metal oxide thin film transistor.

Specifically, the substrate 100 may be a transparent glass substrate or a resin substrate, but the present invention is not limited thereto.

The buffer layer 210 is formed on the substrate 100. The buffer layer 210 may be a $SiN_x/SiO_x$ structure, but the present invention is not limited thereto. The buffer layer 210 may be a $SiN_x$ structure or a $SiO_x$ structure being a single layer. In another embodiment, the buffer layer 210 is alternatively omitted.

The polysilicon layer 220 is formed on the buffer layer 210. Besides, when the buffer layer 210 is omitted, the polysilicon layer 220 is directly formed on the substrate 100. The polysilicon layer 220 comprises a non-doped layer 221, a heavily-doped layer 223 formed at two sides of the non-doped layer 221, and a lightly-doped layer 222 formed between the non-doped layer 221 and the heavily-doped layer 223. The lightly-doped layer 222 is an N-type lightly-doped layer and the heavily-doped layer 223 is an N-type heavily-doped layer, but the present invention is not limited thereto. For example, the lightly-doped layer 222 may be a P-type lightly-doped layer and the heavily-doped layer 223 may be a P-type heavily-doped layer.

The gate insulation layer 230 is formed on the polysilicon layer 220 and the buffer layer 210. The gate insulation layer 230 may be a $SiN_x/SiO_x$ structure, but the present invention is not limited thereto. The gate insulation layer 230 may be a $SiN_x$ structure or a $SiO_x$ structure being a single layer. When the buffer layer 210 is omitted, the gate insulation layer 230 is formed on the polysilicon layer 220 and the substrate 100.

The gate 240 is formed on the gate insulation layer 230 and over the polysilicon layer 220. The gate 240 may be a MoAlMo structure, a TiAlTi structure, a Mo structure, or an Al structure, but the present invention is not limited thereto.

The interlayer insulation layer 250 is formed on the gate 240 and the gate insulation layer 230. The interlayer insulation layer 250 may be a $SiN_x/SiO_x$ structure, but the present invention is not limited thereto. The interlayer insulation layer 250 may be a $SiN_x$ structure or a $SiO_x$ structure being a single layer.

The interlayer insulation layer 250 has a third through hole 251 and a fourth through hole 252, wherein the third through hole 251 and the fourth through hole 252 that penetrate through the gate insulation layer 230, so as to expose the heavily-doped layer 223.

The source 260 and the drain 270 are formed on the interlayer insulation layer 250. The source 260 and the drain 270 respectively fill the third through hole 251 and the fourth through hole 252 to contact the heavily-doped layer 223. The source 260 and the drain 270 may be a MoAlMo structure, a TiAlTi structure, a Mo structure, or an Al structure, but the present invention is not limited thereto.

The flat layer 280 is formed on the interlayer insulation layer 250, the source 260, and the drain 270. The flat layer 280 has a fifth through hole 281 to expose the drain 270.

The bottom electrode 300 is formed on the flat layer 280. The bottom electrode 300 fills the fifth through hole 281 to contact the drain 270 exposed. Usually, the bottom electrode 300 is used as an anode. The bottom electrode 300 may be made of reflective metal. The bottom electrode 300 is sufficiently thin so that light can penetrate it. Thus, the bottom electrode 300 is semi-transparent. Alternatively, the bottom electrode 300 may be made of transparent metal oxide, such indium zinc oxide (ITO) or indium tin oxide (IZO).

The patterned light-blocking layer 400 is formed on the bottom electrode 300. The light-blocking layer 400 has a first through hole 410 to expose the bottom electrode 300. In the exemplary embodiment, the patterned light-blocking layer 400 comprises silicon-rich oxide or silicon-rich nitride that is insulated and opaque, but the present invention is not limited thereto. For example, silicon-rich oxide may be $SiO_x$ having more silicon. When $SiO_x$ is deposited using a chemical vapor deposition (CVD) method, a ratio of $SiH_4$ to $N_2O$ equal to 1:10 is used. Thus, more $SiH_4$ is included. Silicon-rich nitride may be $SiN_x$ having more silicon. When $SiN_x$ is deposited using a chemical vapor deposition method, a ratio of $SiH_4$ to $NH_3$ equal to 1:8 is used. Thus, more $SiH_4$ is included.

The pixel define layer 500 is formed on the flat layer 280, the bottom electrode 300, and the light-blocking layer 400. The pixel define layer 500 has a second through hole 510. The diameter of the second through hole 510 is larger than the diameter of the first through hole 410, whereby the second through hole 510 completely exposes the first through hole 410. Preferably, the central axis of the first through hole 410 is aligned to the central axis of the second through hole 510. The pixel define layer comprises polymethylmethacrylate (PMMA) or polyimide (PI), but the present invention is not limited thereto.

The organic electroluminescent device 600 is formed on the bottom electrode 300, and the edge of the organic electroluminescent device 600 is formed on the light-blocking layer 400. The organic electroluminescent device 600 further comprises a hole injection layer (HIL) 610, a hole transporting layer (HTL) 620, an organic emission layer (EML) 630, an electron transporting layer (ETL) 640, and an electron injection layer (EIL) 650 formed from the bottom electrode 300 to the top electrode 700, but the present invention is not limited thereto.

The top electrode 700 is formed on the organic electroluminescent device 600. Usually, the top electrode 700 is used as a cathode. The top electrode 700 is also a light-reflecting mirror. The top electrode 700 may be made of reflective metal. In addition, the top electrode 700 is sufficiently thick so that the top electrode 700 is opaque to totally reflect light.

The fabrication process of the organic electroluminescent display panel is described as below in detail.

Figure 2A:
FIGS. 2A-2Q are diagrams schematically showing the steps of fabricating an organic electroluminescent display panel according to one embodiment of the present invention.
Figure 2B:
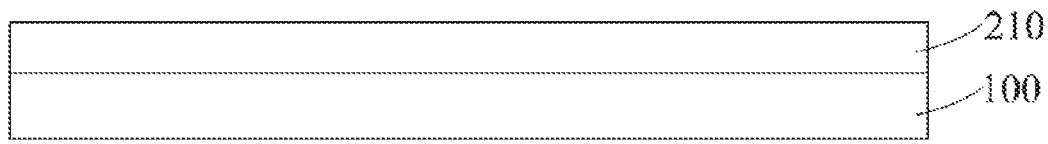
Figure 2C:
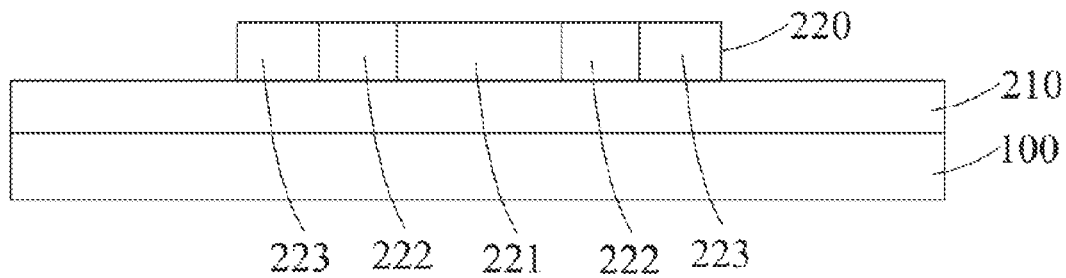
Figure 2D:
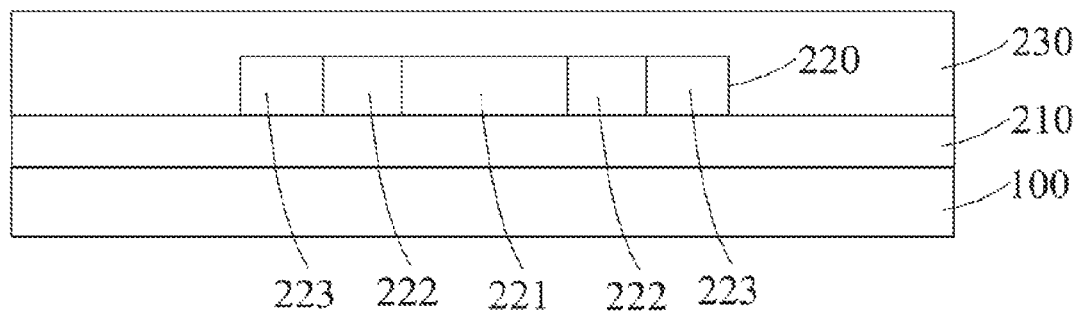
Figure 2E:
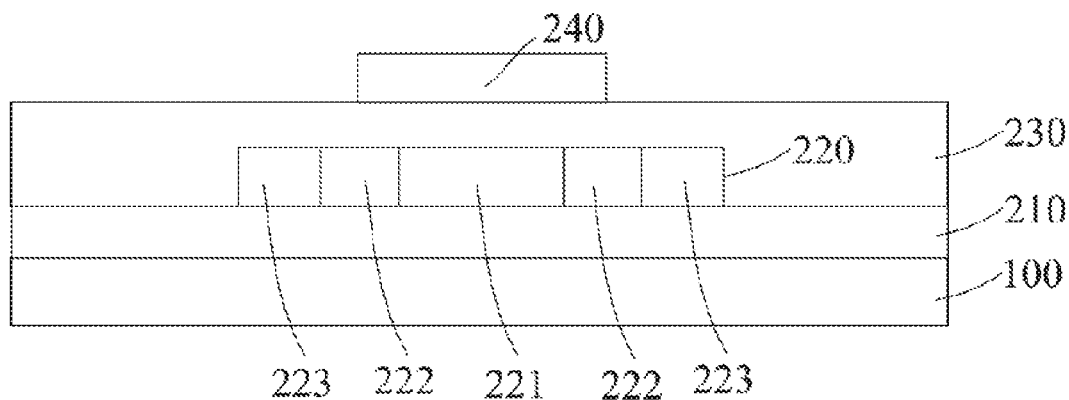
Figure 2F:
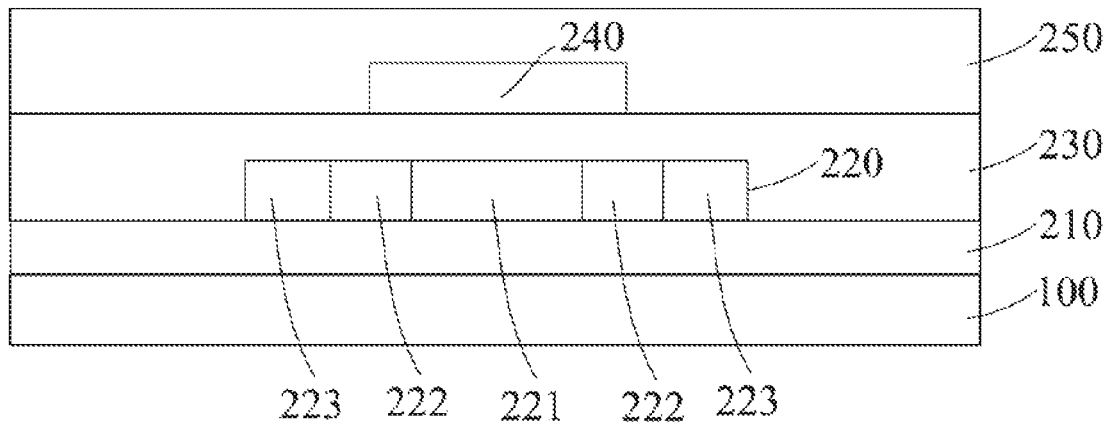
Figure 2G:
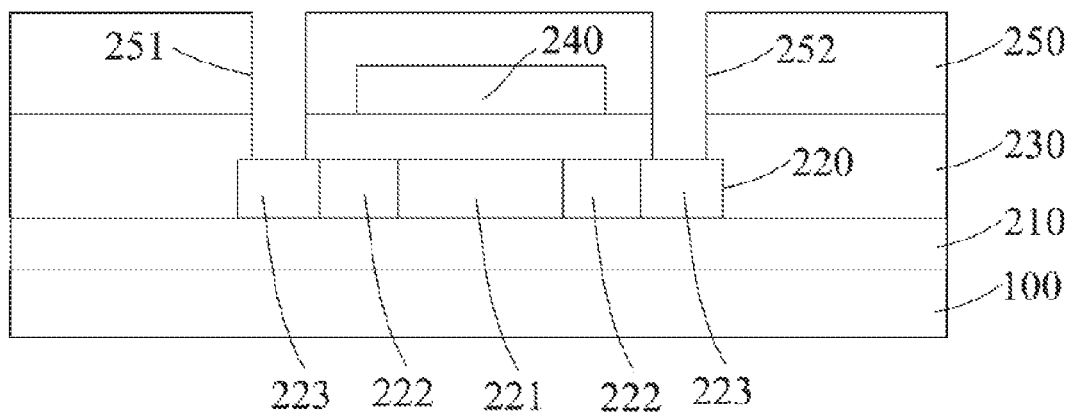
Figure 2H:
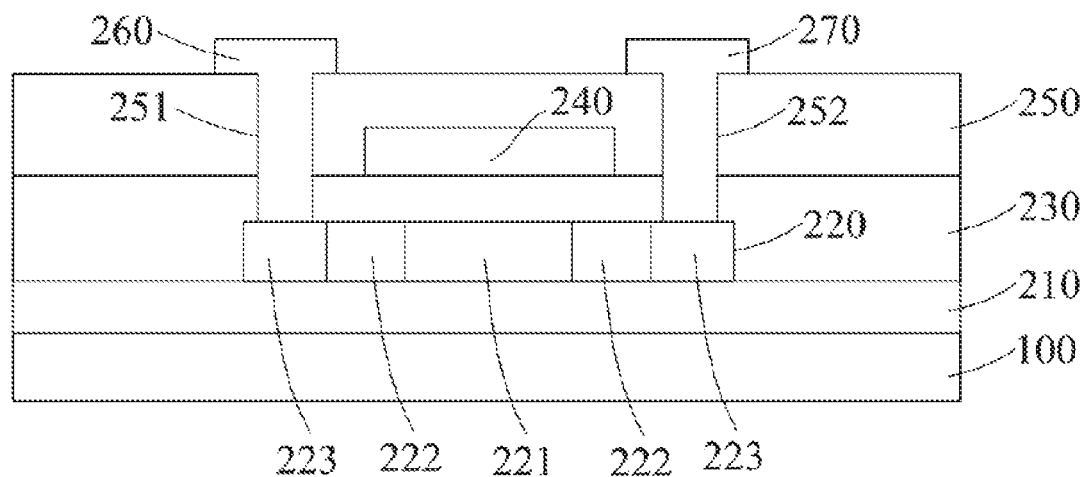
Figure 2I:
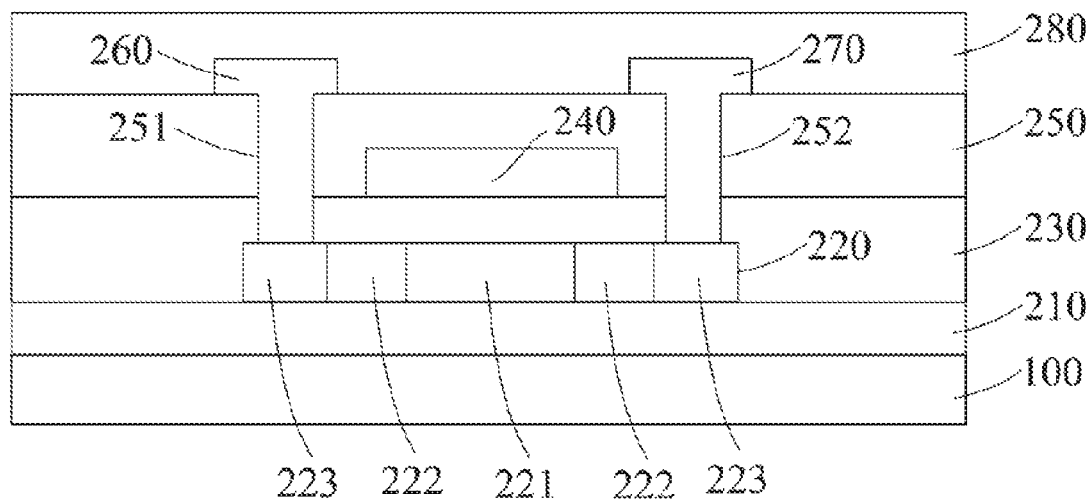
Figure 2J:
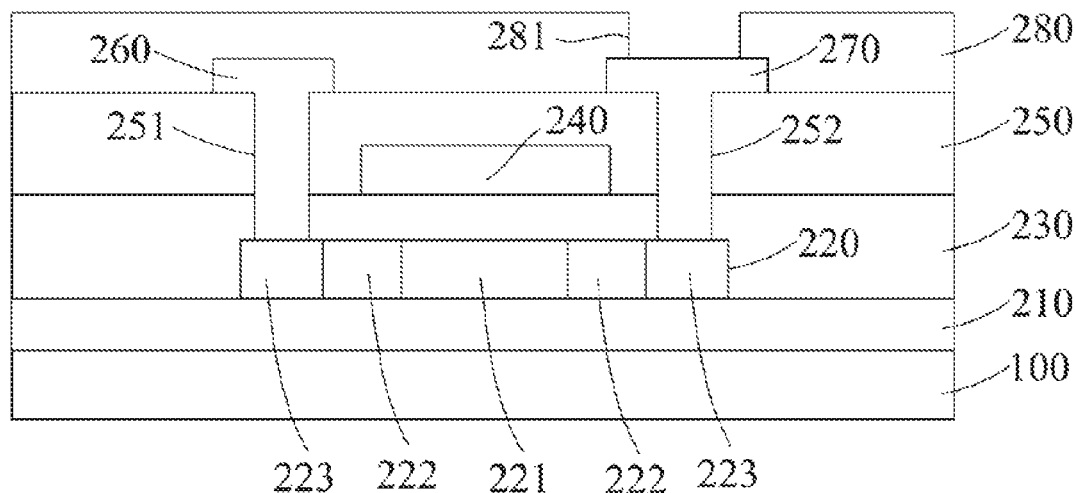
Figure 2K:
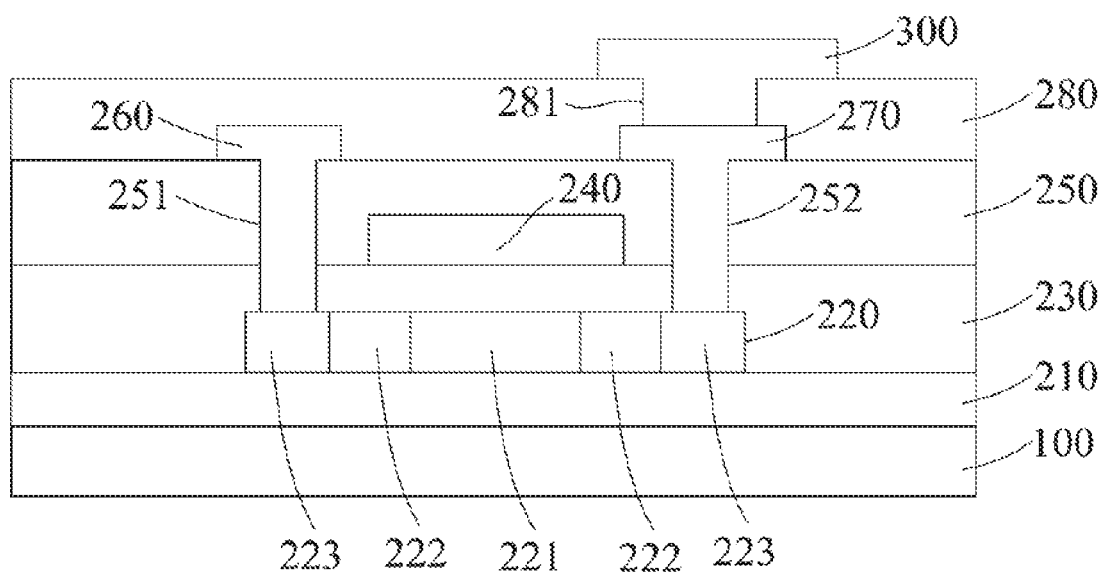
Figure 2L:
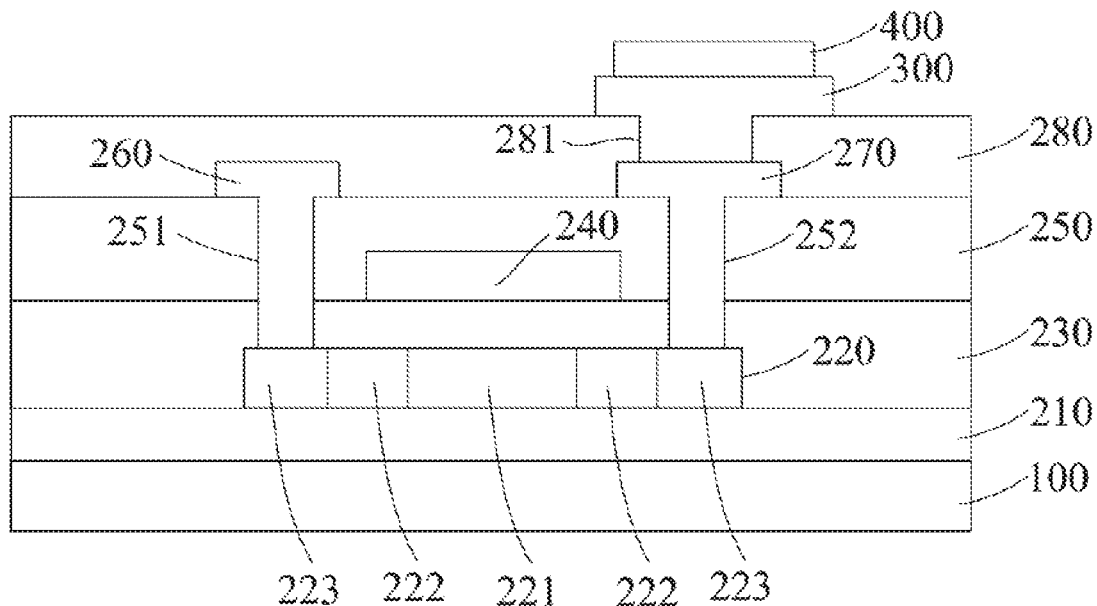
Figure 2M:
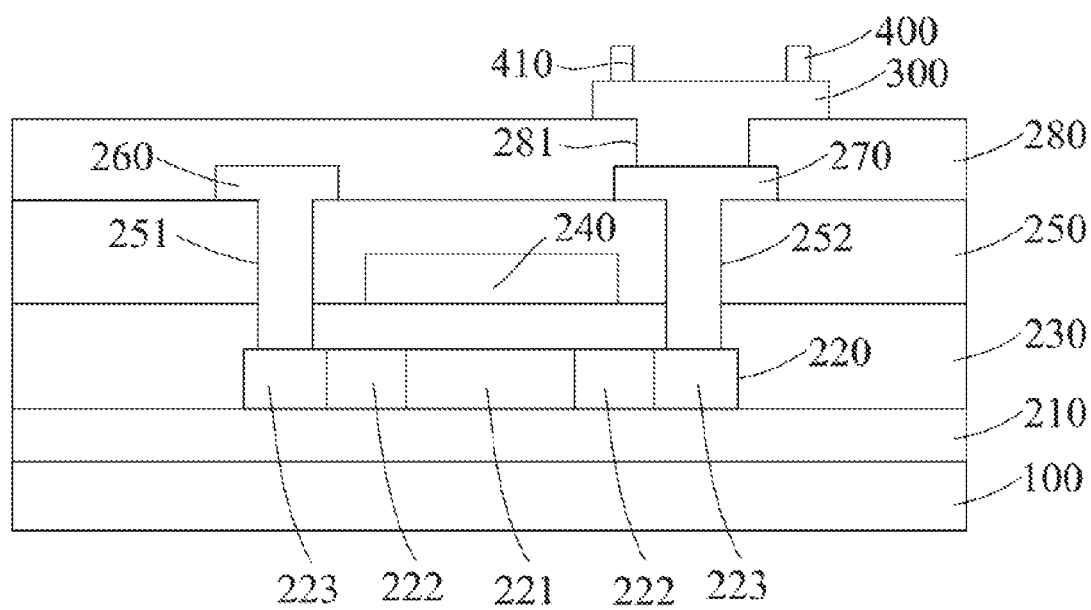
Figure 2N:
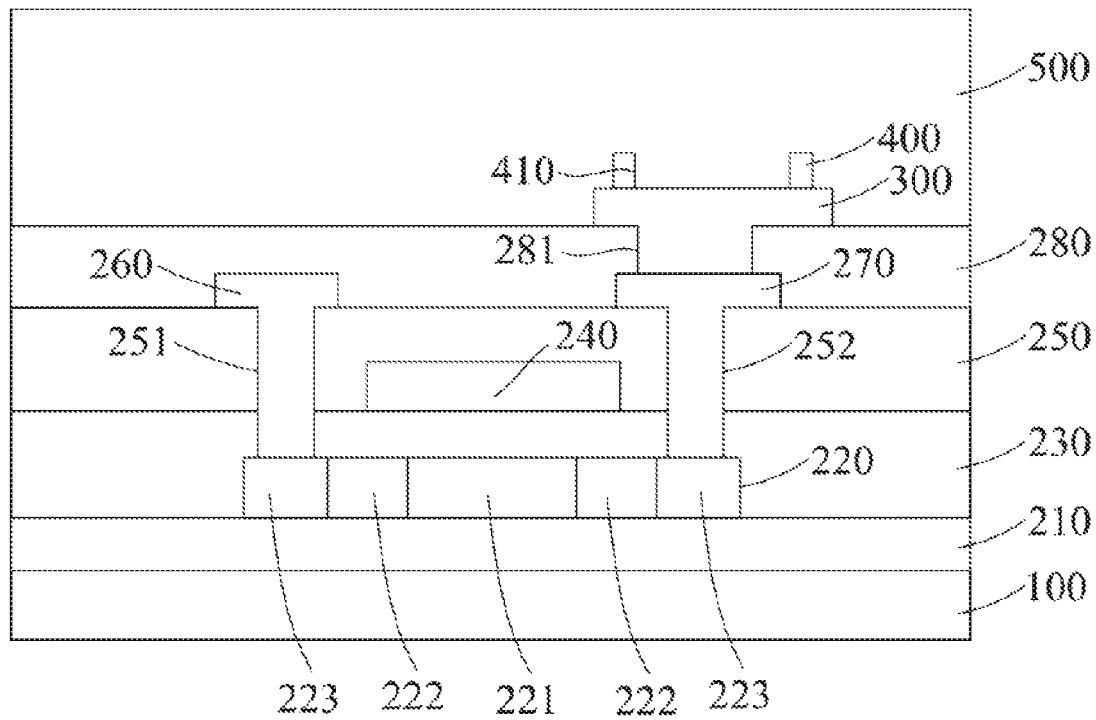
Figure 2O:
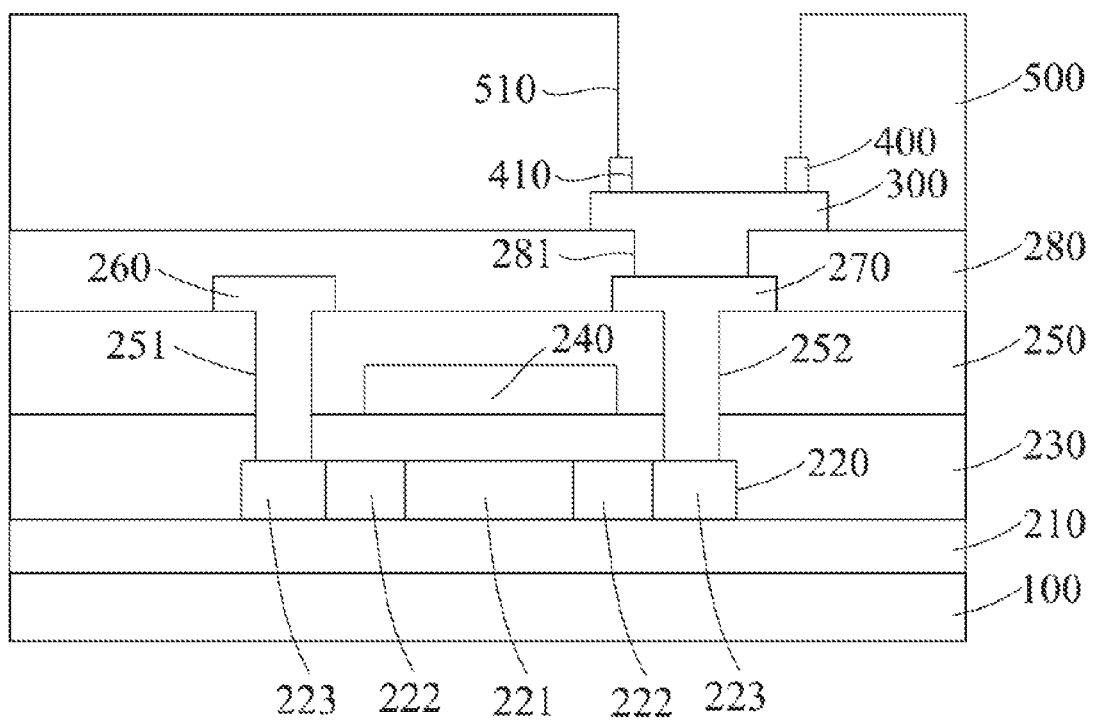
Figure 2P:
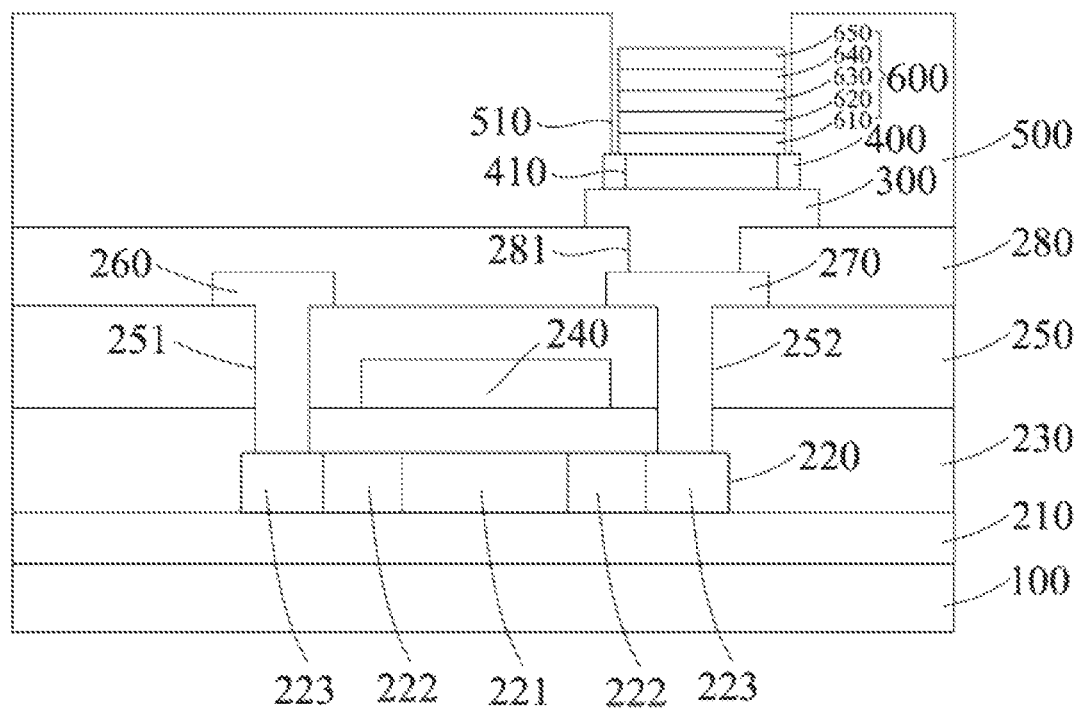
Figure 2Q:
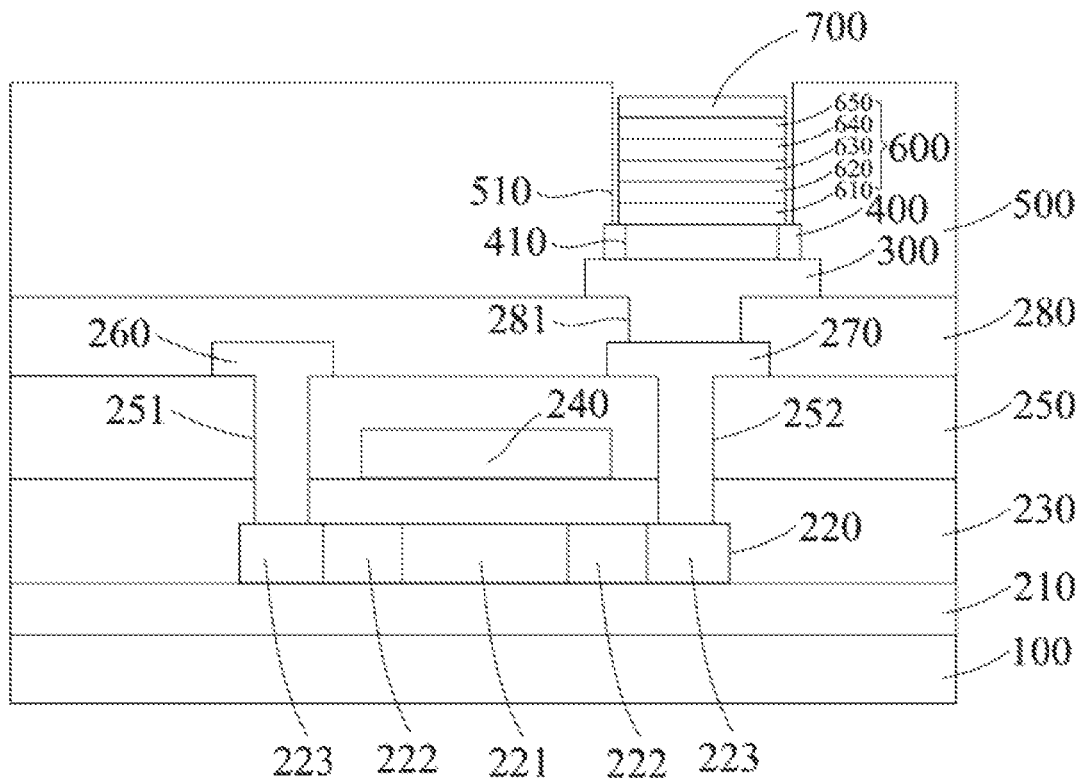

FIGS. 2A-2Q are diagrams schematically showing the steps of fabricating an organic electroluminescent display panel according to one embodiment of the present invention.

Step 1: Refer to FIG. 2A. The substrate 100 is provided. The substrate 100 may be a transparent glass substrate or a resin substrate, but the present invention is not limited thereto.

Step 2: Refer to FIG. 2B. The buffer layer 210 is formed on the substrate 100. The buffer layer 210 may be a $SiN_x/SiO_x$ structure, but the present invention is not limited thereto. The buffer layer 210 may be a $SiN_x$ structure or a $SiO_x$ structure being a single layer. In another embodiment, Step 2 is alternatively omitted.

Step 3: Refer to FIG. 2C. The polysilicon layer 220 is formed on the buffer layer 210. In another embodiment, the polysilicon layer 220 is directly formed on the substrate 100 when Step 2 is omitted. When the polysilicon layer 220 is formed, an amorphous silicon layer is formed on the buffer layer 210 using a plasma-enhanced chemical vapor deposition (PECVD) method, and then an excimer laser is used to crystallize the amorphous silicon layer to form the polysilicon layer 220. The polysilicon layer 220 comprises a non-doped layer 221, a heavily-doped layer 223 formed at two sides of the non-doped layer 221, and a lightly-doped layer 222 formed between the non-doped layer 221 and the heavily-doped layer 223. The lightly-doped layer 222 is an N-type lightly-doped layer and the heavily-doped layer 223 is an N-type heavily-doped layer, but the present invention is not limited thereto. For example, the lightly-doped layer 222 may be a P-type lightly-doped layer and the heavily-doped layer 223 may be a P-type heavily-doped layer.

Step 4: Refer to FIG. 2D. The gate insulation layer 230 is formed on the polysilicon layer 220 and the buffer layer 210. The gate insulation layer 230 may be a $SiN_x/SiO_x$ structure, but the present invention is not limited thereto. The gate insulation layer 230 may be a $SiN_x$ structure or a $SiO_x$ structure being a single layer. When Step 2 is omitted, the gate insulation layer 230 is formed on the polysilicon layer 220 and the substrate 100.

Step 5: Refer to FIG. 2E. The gate 240 is formed on the gate insulation layer 230 and over the polysilicon layer 220. The gate 240 may be a MoAlMo structure, a TiAlTi structure, a Mo structure, or an Al structure, but the present invention is not limited thereto.

Step 6: Refer to FIG. 2F. The interlayer insulation layer 250 is formed on the gate 240 and the gate insulation layer 230. The interlayer insulation layer 250 may be a $SiN_x/SiO_x$ structure, but the present invention is not limited thereto. The interlayer insulation layer 250 may be a $SiN_x$ structure or a $SiO_x$ structure being a single layer.

Step 7: Refer to FIG. 2G. The third through hole 251 and the fourth through hole 252 are formed in the interlayer insulation layer 250, wherein the third through hole 251 and the fourth through hole 252 penetrate through the gate insulation layer 230, so as to expose the heavily-doped layer 223.

Step 8: Refer to FIG. 2H. The source 260 and the drain 270 are formed on the interlayer insulation layer 250. The source 260 and the drain 270 respectively fill the third through hole 251 and the fourth through hole 252 to contact the heavily-doped layer 223. The source 260 and the drain 270 may be a MoAlMo structure, a TiAlTi structure, a Mo structure, or an Al structure, but the present invention is not limited thereto.

Step 9: Refer to FIG. 2I. The flat layer 280 is formed on the interlayer insulation layer 250, the source 260, and the drain 270.

Step 10: Refer to FIG. 2J. The fifth through hole 281 is formed in the flat layer 280 to expose the drain 270.

Steps 2-10 can form the thin film transistor 200 according to an embodiment of the present invention. It is noted that the steps of fabricating the thin film transistor is correspondingly varied when its structure varies.

Step 11: Refer to FIG. 2K. The bottom electrode 300 is formed on the flat layer 280. The bottom electrode 300 fills the fifth through hole 281 to contact the drain 270 exposed. Usually, the bottom electrode 300 is used as an anode. The bottom electrode 300 may be transparent or semi-transparent.

Step 12: Refer to FIG. 2L. The patterned light-blocking layer 400 is formed on the bottom electrode 300. The patterned light-blocking layer 400 comprises silicon-rich oxide or silicon-rich nitride that is insulated and opaque, but the present invention is not limited thereto.

Step 13: Refer to FIG. 2M. The first through hole 410 is formed in the light-blocking layer 400 to expose the bottom electrode 300.

Step 14: Refer to FIG. 2N. The pixel define layer 500 is formed on the flat layer 280, the bottom electrode 300, and the light-blocking layer 400. The pixel define layer comprises polymethylmethacrylate (PMMA) or polyimide (PI), but the present invention is not limited thereto.

Step 15: Refer to FIG. 2O. The second through hole 510 is formed in the pixel define layer 500. The diameter of the second through hole 510 is larger than the diameter of the first through hole 410, whereby the second through hole 510 completely exposes the first through hole 410. Preferably, the central axis of the first through hole 410 is aligned to the central axis of the second through hole 510.

Step 16: Refer to FIG. 2P. The organic electroluminescent device 600 is formed on the bottom electrode 300, and the edge of the organic electroluminescent device 600 is formed on the light-blocking layer 400. The organic electroluminescent device 600 further comprises a hole injection layer (HIL) 610, a hole transporting layer (HTL) 620, an organic emission layer (EML) 630, an electron transporting layer (ETL) 640, and an electron injection layer (EIL) 650 formed from the bottom electrode 300 to the top electrode 700, but the present invention is not limited thereto.

Step 17: Refer to FIG. 2Q. The top electrode 700 is formed on the organic electroluminescent device 600. The top electrode 700 is opaque to totally reflect light.

In conclusion, the organic electroluminescent display panel and a method for fabricating the same of the present invention eliminate the non-uniform brightness of the edge of the organic electroluminescent device.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. An organic electroluminescent display panel comprising:
    a substrate;
    a thin film transistor formed on the substrate;
    a bottom electrode formed on a drain of the thin film transistor;
    a light-blocking layer formed on the bottom electrode, wherein the light-blocking layer has a first through hole that exposes the bottom electrode;
    a pixel define layer formed on the thin film transistor, the bottom electrode, and the light-blocking layer, wherein the pixel define layer has a second through hole, a diameter of the second through hole is larger than a diameter of the first through hole, and the second through hole completely exposes the first through hole;
    an organic electroluminescent device formed on the bottom electrode, and an edge of the organic electroluminescent device formed on the light-blocking layer; and
    a top electrode formed on the organic electroluminescent device;
    wherein the organic electroluminescent device further comprises a hole injection layer, a hole transporting layer, an organic emission layer, an electron transporting layer, and an electron injection layer formed from the bottom electrode to the top electrode.

2. The organic electroluminescent display panel according to claim 1, wherein a central axis of the first through hole is aligned to a central axis of the second through hole.

3. The organic electroluminescent display panel according to claim 1, wherein the light-blocking layer comprises silicon-rich oxide or silicon-rich nitride, the light-blocking layer is insulated and opaque.

4. The organic electroluminescent display panel according to claim 1, wherein the pixel define layer comprises polymethylmethacrylate (PMMA) or polyimide (PI).

5. The organic electroluminescent display panel according to claim 1, wherein the thin film transistor further comprises:
    a polysilicon layer formed on the substrate, and the polysilicon layer comprises a non-doped layer, a heavily-doped layer formed at two sides of the non-doped layer, and a lightly-doped layer formed between the non-doped layer and the heavily-doped layer;
    a gate insulation layer formed on the polysilicon layer and the substrate;
    a gate formed on the gate insulation layer and over the polysilicon layer;
    an interlayer insulation layer formed on the gate and the gate insulation layer;
    a third through hole and a fourth through hole respectively penetrating through the interlayer insulation layer and the gate insulation layer;
    a source and a drain formed on the interlayer insulation layer, and contacting the heavily-doped layer via the first through hole and the second through hole;
    a flat layer formed on the interlayer insulation layer, the source, and the drain; and
    a fifth through hole penetrating through the flat layer to expose the drain.

6. The organic electroluminescent display panel according to claim 5, wherein the thin film transistor further comprises a buffer layer formed between the substrate and both of the polysilicon layer and the gate insulation layer.

7. The organic electroluminescent display panel according to claim 5, wherein the organic electroluminescent device further comprises a hole injection layer, a hole transporting layer, an organic emission layer, an electron transporting layer, and an electron injection layer formed from the bottom electrode to the top electrode.

8. The organic electroluminescent display panel according to claim 6, wherein the organic electroluminescent device further comprises a hole injection layer, a hole transporting layer, an organic emission layer, an electron transporting layer, and an electron injection layer formed from the bottom electrode to the top electrode.

9. The organic electroluminescent display panel according to claim 1, wherein the bottom electrode is transparent or semi-transparent, and the top electrode is opaque and light-reflecting.

* * * * *